United States Patent [19]
Muramatsu

[11] Patent Number: 5,976,390
[45] Date of Patent: Nov. 2, 1999

[54] MICROMACHINING METHOD AND MICROMACHINED STRUCTURE

[75] Inventor: Hiroshi Muramatsu, Chiba, Japan

[73] Assignee: Seiko Instruments Inc., Japan

[21] Appl. No.: 08/769,376

[22] Filed: Dec. 19, 1996

[30] Foreign Application Priority Data

Mar. 7, 1996 [JP] Japan .................................. 8-050582

[51] Int. Cl.⁶ .............................. H01L 21/00; B44C 1/22
[52] U.S. Cl. .................................. 216/2; 216/52; 216/65; 216/79
[58] Field of Search .................. 216/2, 52, 65, 216/79

[56] References Cited

U.S. PATENT DOCUMENTS

| | | | |
|---|---|---|---|
| 3,908,110 | 9/1975 | Heft | 219/121 LM |
| 4,783,237 | 11/1988 | Aine et al. | 216/2 X |
| 4,891,255 | 1/1990 | Ciarlo | 216/2 X |
| 5,179,499 | 1/1993 | MacDonald et al. | 216/79 X |
| 5,364,497 | 11/1994 | Chau et al. | 216/65 X |
| 5,537,276 | 7/1996 | Mukae et al. | 360/109 |

FOREIGN PATENT DOCUMENTS

| | | |
|---|---|---|
| 098999A1 | 1/1984 | European Pat. Off. . |
| 317830A1 | 5/1989 | European Pat. Off. . |
| 2918100 | 11/1980 | Germany . |
| WO9610833 | 4/1996 | WIPO . |

OTHER PUBLICATIONS

Patent Abstracts of Japan, vol. 011, No. 301, (M–628) Sep. 30, 1987.

*Primary Examiner*—William Powell
*Attorney, Agent, or Firm*—Adams & Wilks

[57] ABSTRACT

A minute structure such as a cantilever 11 is formed on a silicon substrate 10 and heated by irradiating a laser beam to a part of the cantilever 11, by which the cantilever 11 is bent. The two bent cantilevers 11 are inserted into through holes 14 in a crystal substrate 10 formed in advance, and the tip end portions 15 thereof are heated. The heared tip end portions 15 become thicker and at the same time shorter, so that the crystal substrate 12 can be fixed to the silicon substrate 10 without play. By heating a part of the minute structure by such a method, plastic deformation is produced, so that bending and deforming can be performed. Thereby, a three-dimensional micromachined structure is constructed and assembled.

29 Claims, 11 Drawing Sheets

MICROMACHINING METHOD AND MICROMACHINED STRUCTURE

BACKGROUND OF THE INVENTION

The present invention relates to a micromachining method for forming a three-dimensional microstruture minute structure and to a three-dimensional microstructure formed by the micromachining method.

A so-called micromachining for forming micromachines and other microstructures by using a micromachining technology is expected to be applied in various fields. As today's micromachining technology, a method in which a two-dimensional photolithography technology and an anisotropic etching technology are combined is mainly used to form a minute structure (or microstructure) of several micrometers to several millimeters. In addition, a technology in which a workpiece is cut by using a laser beam to form a two-dimensional structure is available. Also, a bonding technology is known in which bonding of silicon substrates to each other or a silicon substrate to a glass substrate etc. can be accomplished by using an anodic bonding technology.

The limitation in conventional two-dimensional micromachining technology is that even when a three-dimensional structure is formed by combining a plurality of pares, the three-dimensional height of structure is restricted by the thickness of the original substrate. This limitation constitutes an enormous obstacle in manufacturing a mobile structure, a three-dimensional sensor, and the like.

Further, the prior art has a disadvantage that in it is difficult to manufacture a multilayer structure. For the construction of the multilayer structure, a bonding technology used for substrates is available. However, the bonding of substrates requires heating or other processing, so that the bonding strength and the durability, which depend on the difference in coefficient of thermal expansion and the condition of bonded surface, are liable to be unreliable. Also, since a bonded surface of a given range is required, the area of the bonded surface on the substrate must be large with respect to the functional portion. Moreover, the bonding technology is unsuitable for assembling a complicated structure.

SUMMARY OF THE INVENTION

Accordingly, it is an object of the present invention to provide a micromachining method for machining a microstructure by bending the microstructure and deforming a minute tip end.

It is another object of the present invention to provide a micromachining method for joining microstructures to each other.

It is another object of the present invention to provide a micromachining method which is readily adaptable for the formation of a three-dimensional microstructure.

DETAILED DESCRIPTION OF THE INVENTION

To solve the above problems in forming a three-dimensional minute structure, or microstructure, having a second shape, according to the present invention, a plastic deformation is produced by heating a two-dimensional minute structure having a first shape using a heating means to form a three-dimensional structure. Also, by such a method, a minute structure formed by a three-dimensional structure having a plastically deformed portion of minute structure with thermoplasticity can be obtained. Further, by joining a plurality of minute structures by the plastically deformed portion, a more complicated micromachined structure can be obtained.

According to the present invention, in machining of a minute structure, plastic deformation is produced by local heating using a heating means to form a three-dimensional structure.

The aforementioned minute structure can be formed easily by applying photolithography and anisotropic etching technologies to a mono-crystalline substrate.

For the aforementioned heating means, heating by the absorption of electromagnetic wave energy, which is developed by the irradiation of an electromagnetic wave, by the minute structure, is effective. Further, a laser beam can be applied easily as the electromagnetic wave.

Also, the aforementioned minute structure is adapted to have a cantilever-like structure at a part thereof, and by heating a part of the cantilever-like structure, the cantilever is bent, by which a three-dimensional structure can be formed.

Alternatively, the aforementioned minute structure is adapted to have thin connecting portions in the interior thereof, and by heating the connecting portions, a three-dimensional structure can be formed with the connecting portions being a fold.

Further, the aforementioned minute structure has a cantilever-like structure at a part thereof, and by heating the tip end portion of the cantilever-like structure, the tip end portion is melted, by which the tip end portion of the cantilever can be formed so that the diameter thereof is larger than that before melting.

Also, a cantilever of a first minute structure having a cantilever-like structure is inserted into a through hole in a second minute structure having the through hole, and the tip end of cantilever having passed through the hole is heated by a heating means to produce a plastic deformation, by which the first and second minute structures can be joined to each other.

The periphery of the workpiece is preferably protected by an electromagnetic wave shutoff material. A metallic thin film is suitable for the electromagnetic wave shutoff or blocking material.

The electromagnetic wave is made to propagate by means of a wave guide, and the local heating can be performed by the irradiation of electromagnetic wave from the end face of the wave guide.

Also, it is preferable that the tip end portion of the wave guide be sharpened, and be covered by an electromagnetic shutoff material so that a small opening is formed at the end face of tip end portion.

The working is performed with the tip end portion of the wave guide in contact with the surface of workpiece with a weak force by detecting an elastic displacement of the tip end portion of the wave guide having an elastic portion and by carrying out control so that the tip end portion of the wave director is at a predetermined position, by which finer and wide-range working can be performed.

By the above-described machining method, a micromachined structure formed by a three-dimensional structure having a plastically deformed portion formed by local heating of a minute structure having thermoplasticity can be obtained.

The above mentioned minute structure can be formed by the photolithography and anisotropic etching technologies applied to a mono-crystalline substrate.

Silicon or crystal is suitable for the above mentioned mono-crystalline substrate.

Even a complicated structure, which comprises a first minute structure having a cantilever-like structure and a second structure having a through hole, can easily be realized by inserting the cantilever of the first minute structure into the through hole of the second minute structure, and by joining the first minute structure and the second minute structure by a plastically deformed portion formed by heating the tip end portion of the cantilever having passed through the hole to form a three-dimensional structure.

Figure 1A:
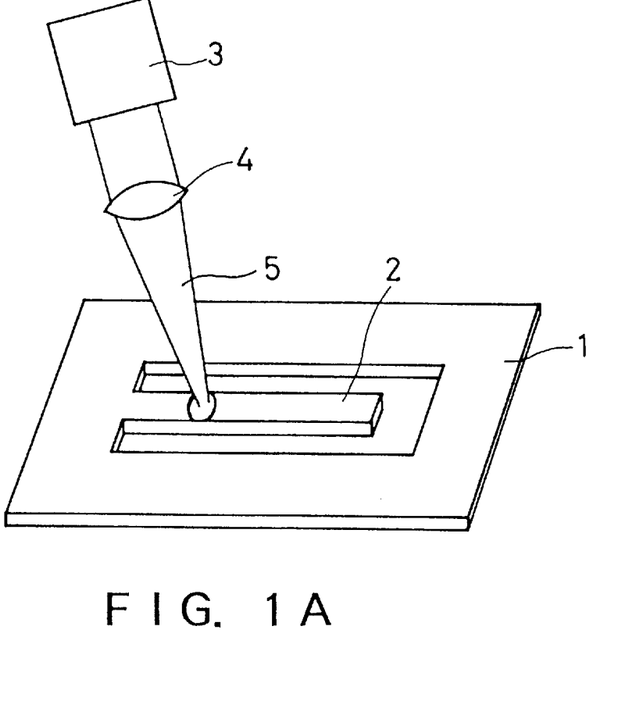
FIGS. 1(a) and 1(b) are views for illustrating a method for bending a cantilever structure in accordance with the present invention.
Figure 1B:
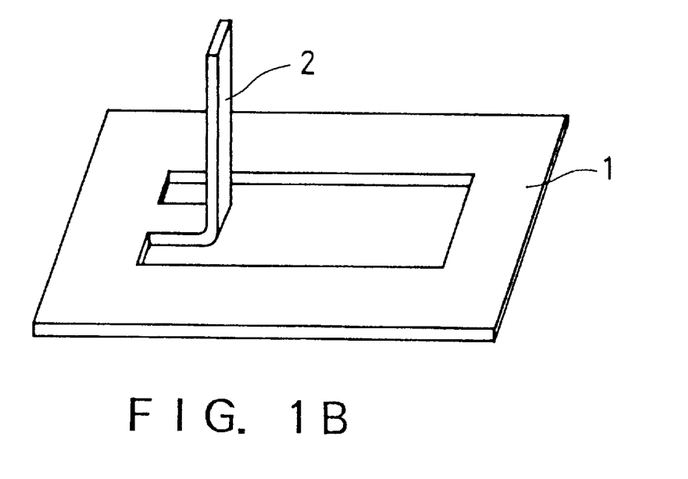

FIGS. 1(a) and 1(b) show one example of a micromachining method in accordance with the present invention. When a laser beam 5, which is generated from a carbon dioxide laser 3 and converged by an optical system such as a lens 4, is irradiated onto a part of a cantilever 2 formed on a silicon mono-crystalline substrate 1 by photolithography and anisotropic etching technologies, heat is generated by absorbing the optical energy at the portion irradiated by the laser beam 5. This heat melts part of the silicon substrate on the side to which the laser beam 5 is irradiated, so that the surface tension of this melted portion can bend the cantilever 2 to the side to which the laser beam 5 is irradiated. Thereupon, a deformation from FIG. 1(a) to FIG. 1(b) is accomplished by this working.

By setting the angle at which the laser beam 5 is applied at an angle larger than the verticality viewed from the tip end of cantilever with respect to the cantilever 2 to be bent, the bending angle can be made over 90 degrees. Also, by increasing the beam diameter of the laser beam 5, the curvature of the bent portion can be increased, and inversely, by decreasing the beam diameter, the curvature can be decreased.

Figure 2A:
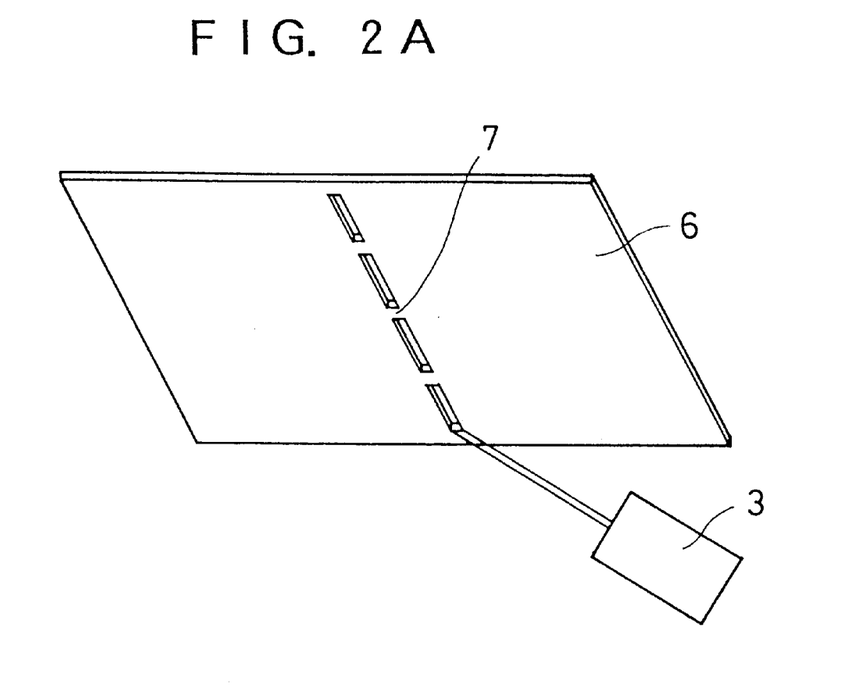
FIGS. 2(a) and 2(b) are views for illustrating a method for bending a microstructure in accordance with the present invention.
Figure 2B:
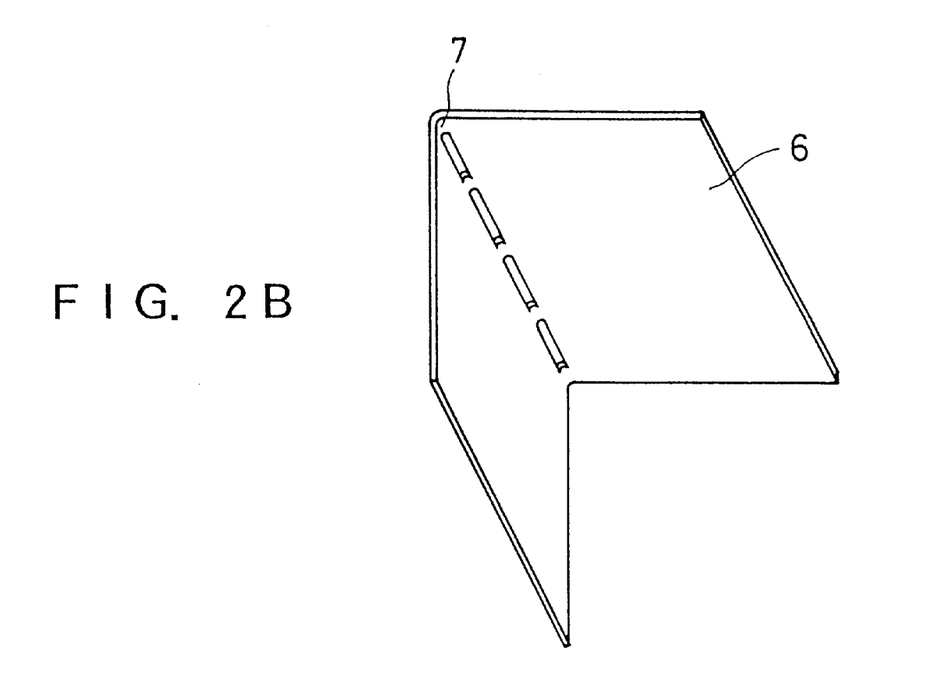

FIGS. 2(a) and 2(b) show a bending method for changing the whole of a minute structure. In FIG. 2(a), by repeatedly irradiating the laser beam 5 of the carbon dioxide laser 3 to connecting portions 7 of a silicon mono-crystalline substrate 6 having connecting portions 7 formed finely partially in the structure, the connecting portions 7 are softened. Thereby, the angle can be changed in the direction of gravity or applied force. Thereupon, a deformation from FIG. 2(a) to FIG. 2(b) is accomplished by this working.

In this working, the control of position and diameter of the laser beam 5 for the working is important. Moreover, since the energy absorption occurs selectively at an uncovered portion by covering in advance the periphery of the portion to be worked with a metallic material such as gold for shutting off the electromagnetic wave, the working accuracy can be enhanced.

Figure 3A:
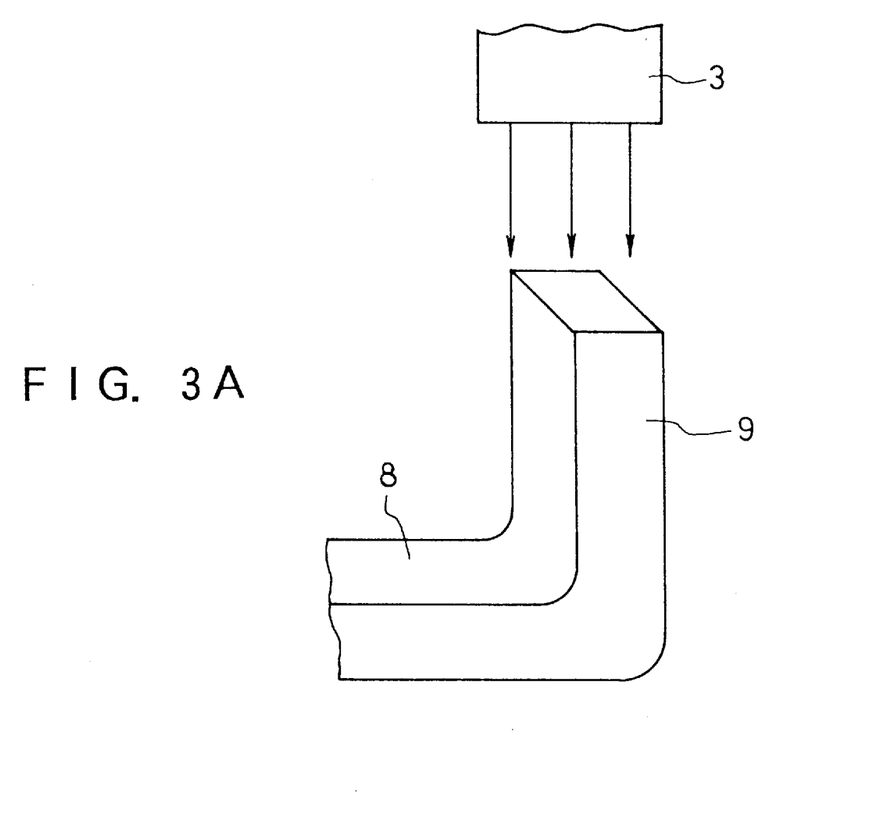
FIGS. 3(a) and 3(b) are views for illustrating a method for processing a tip end of microstructure in accordance with the present invention.
Figure 3B:
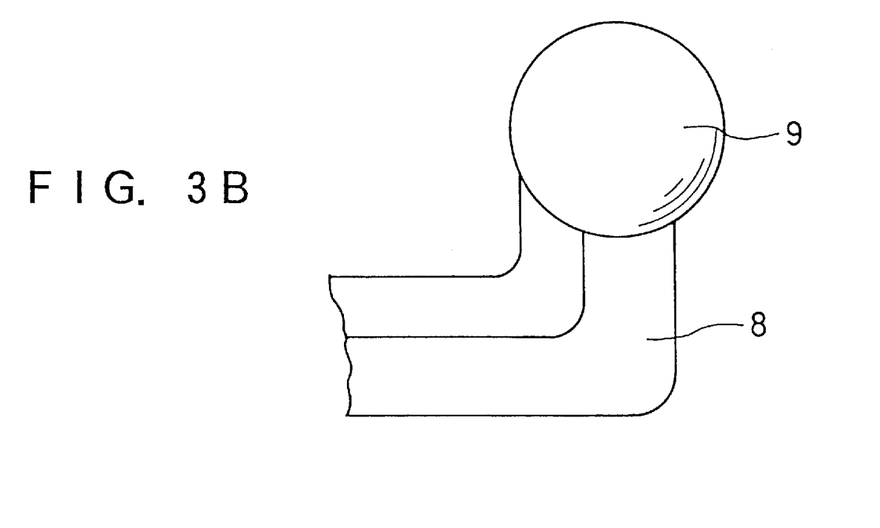

FIGS. 3(a) and 3(b) show another example of a micromachining method in accordance with the present invention. This figure shows that by heating a tip end portion 9 of a cantilever 8 having been bent as shown in FIG. 1, the tip end 9 is melted and deformed into a spherical shape by the surface tension thereof, by which the diameter of the tip end portion 9 of the cantilever 8 can be made larger than that before melting.

By combining the working methods shown in FIGS. 1(a) and 1(b) and 3(a) and 3(b), the assembly of a minute structure can be performed.

FIGS. 4(a)–4(d) show a method in which a silicon substrate 10, which incorporates a crystal oscillating circuit etc. and is formed into a construction of a shape of cantilever 11, is integrated with a crystal substrate 12, which incorporates a tuning-fork type crystal oscillator 13 and has through holes 14 at the periphery thereof.

Figures 4A, 4B, 4C, 4D:
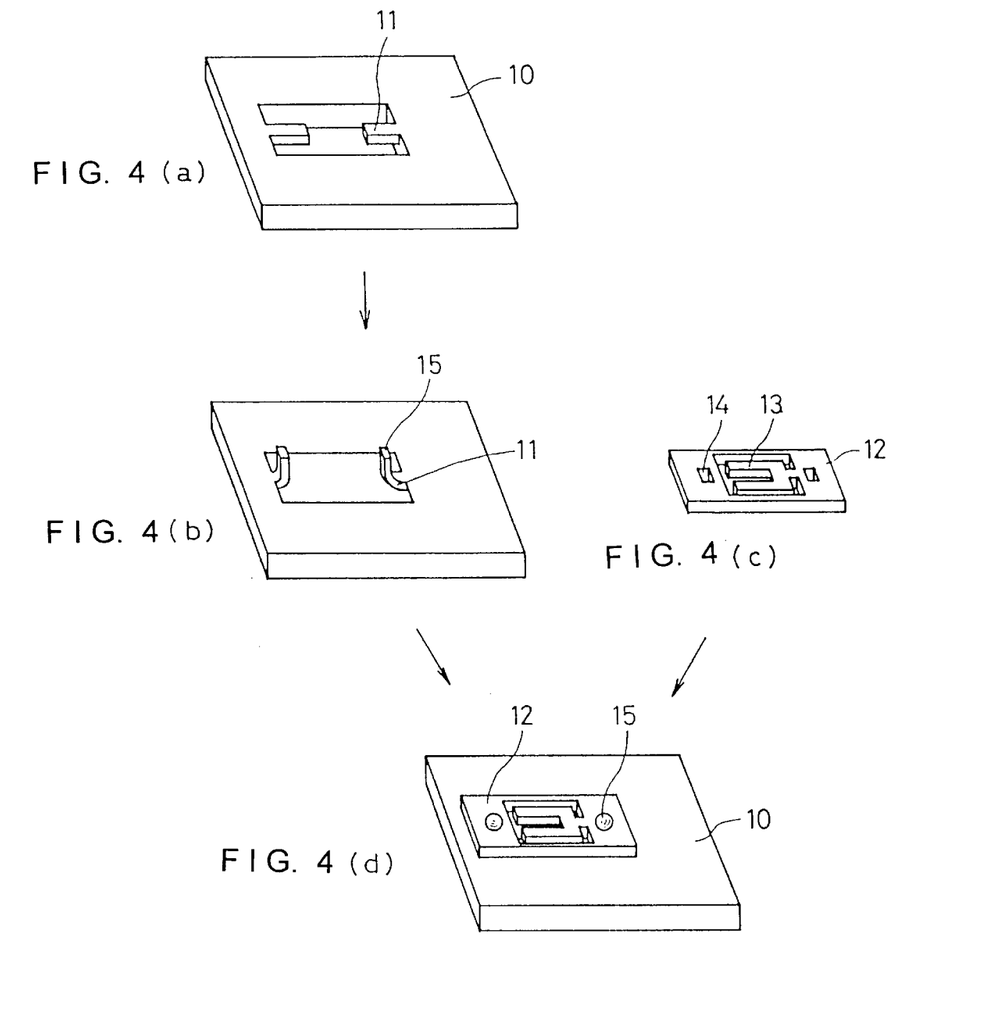
FIGS. 4(a) to 4(d) are views for illustrating a method for joining a silicon IC substrate and a crystal oscillator substrate in accordance with the present invention.

First, on the silicon substrate 10 having a construction of a shape of cantilever 11 as shown in FIG. 4(a), the cantilevers 11 are bent as shown in FIG. 4(b) by the working method shown in FIG. 1. The two bent cantilevers 11 are inserted into the through holes 14 formed in advance in the crystal substrate 12 as shown in FIG. 4(c), and tip end portions 15 having passed through the holes are heated. The heated tip end portion 15 is made thicker and at the same time shorter, so that the crystal substrate 12 can be fixed onto the silicon substrate 10 without play as shown in FIG. 4(d).

In this process, the electrical connection of electrode pattern between the silicon substrate 10 and the crystal substrate 12 can be mad e easily by wire bonding. Also, by piling up the silicon substrates similarly, a multilayer IC can be configured. This joining can be performed by two methods: a method in which joining is performed after separating into individual parts and a method in which joining is performed by wafer unit and then cutting is done into individual chips.

Figure 5A:
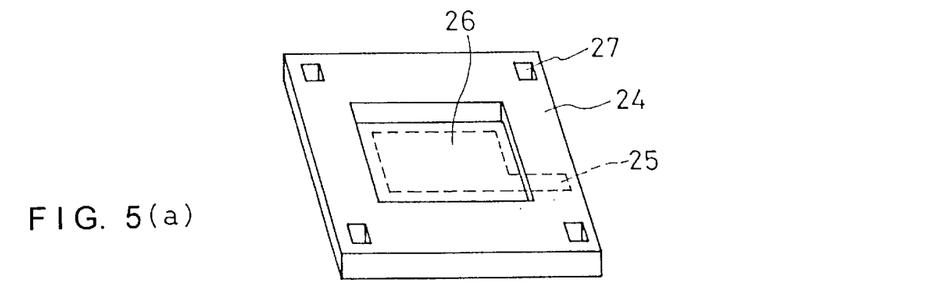
FIGS. 5(a) to 5(c) are views for illustrating a method for constructing a diaphragm type pressure sensor in accordance with the present invention.
Figure 5B:
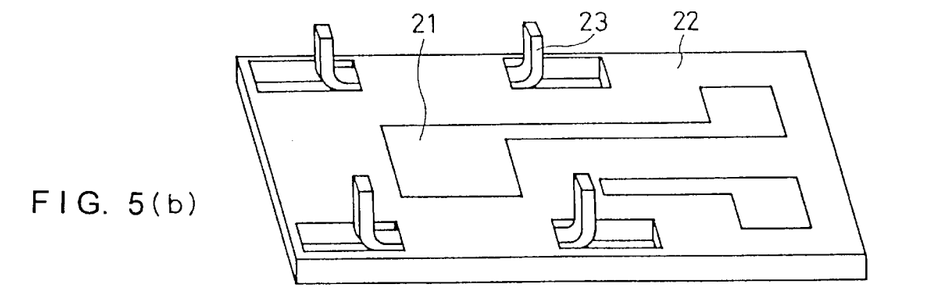
Figure 5C:
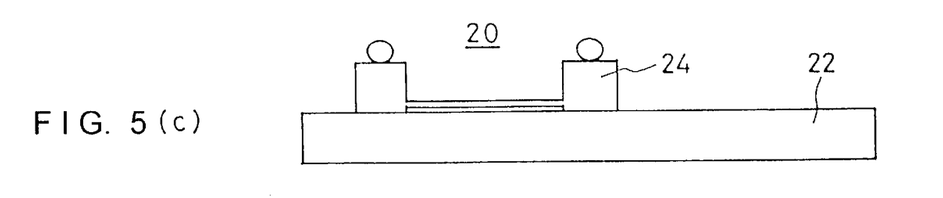

As another joining example, FIGS. 5(a)–5(c) show a method for constructing a pressure sensor 20 sin a diaphragm.

First, on a silicon substrate 22 which has electrodes 21 at the center thereof and is formed with four cantilevers 23 as shown in FIG. 5(b), the cantilevers 23 are bent by the method shown in FIG. 1. Next, through holes 27 are formed in a silicon substrate 24 having a diaphragm 26 formed with an electrode 25 as shown in FIG. 5(a). The cantilevers 23 are inserted into the through holes 27, and the tip ends of the cantilevers 23 having passed through the holes are heated, by which the silicon substrate 22 and the silicon substrate 24 can be joined to each other as shown in FIG. 5(c).

Thus, the diaphragm type pressure sensor 20 can be assembled. By applying a low-viscosity high-molecular adhesive between the substrates, the airtightness between the substrates can be enhanced.

Figure 6:
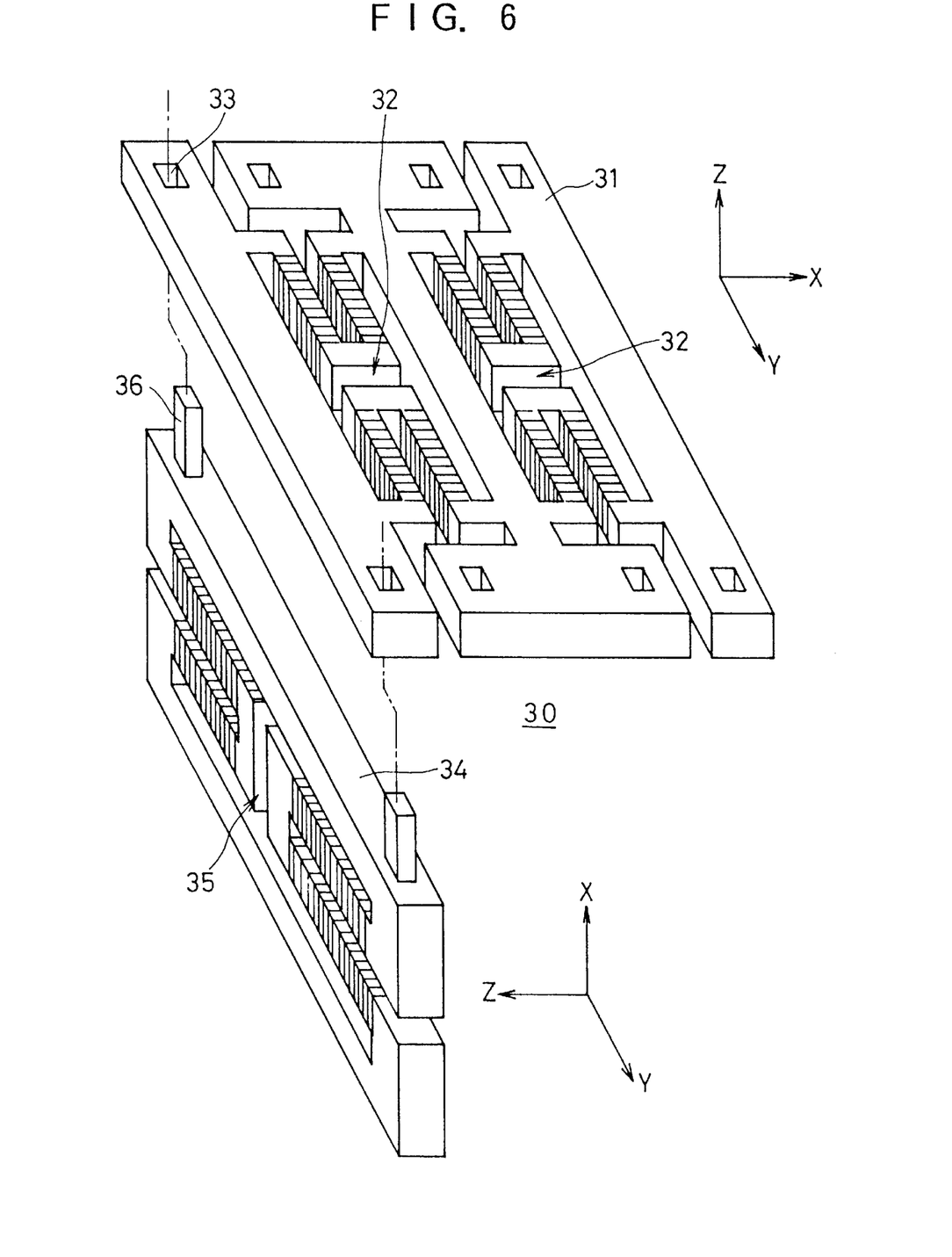
FIG. 6 is a view for illustrating a configuration of minute mobile mechanism and a processing method for the same in accordance with the present invention.

Next, a typical configuration of a minute mobile mechanism 30 using the machining technology in accordance with the present invention will be described. Referring to FIG. 6, eight through holes 33 are formed in a Z plate crystal substrate 31 formed with two comb tooth shaped displacement mechanisms 32. Two cantilevers 36 are formed on a Z plate crystal substrate 34 formed with one comb tooth shaped displacement mechanism 35. Although only one Z plate crystal substrate 34 is drawn in the figure for simplicity, after each cantilever 36 of four Z plate crystal substrates 34 is inserted into each of eight through holes 33, the tip end of the cantilever 36 having passed through the hole is heated and deformed by using the method shown in FIG. 3. Thus, a three-dimensional structure, in which four Z plate crystal substrates 34 are joined to one Z plate crystal substrate 31 by a plastically deformed portion, is formed. In the comb tooth shaped displacement mechanisms 32 and 35, electrodes are formed individually on four faces of a crystal rod shown by stripes in FIG. 6, so that a displacement of a crystal plate in the X crystal axis direction can be obtained by applying a voltage.

Figures 7A, 7B, 7C:
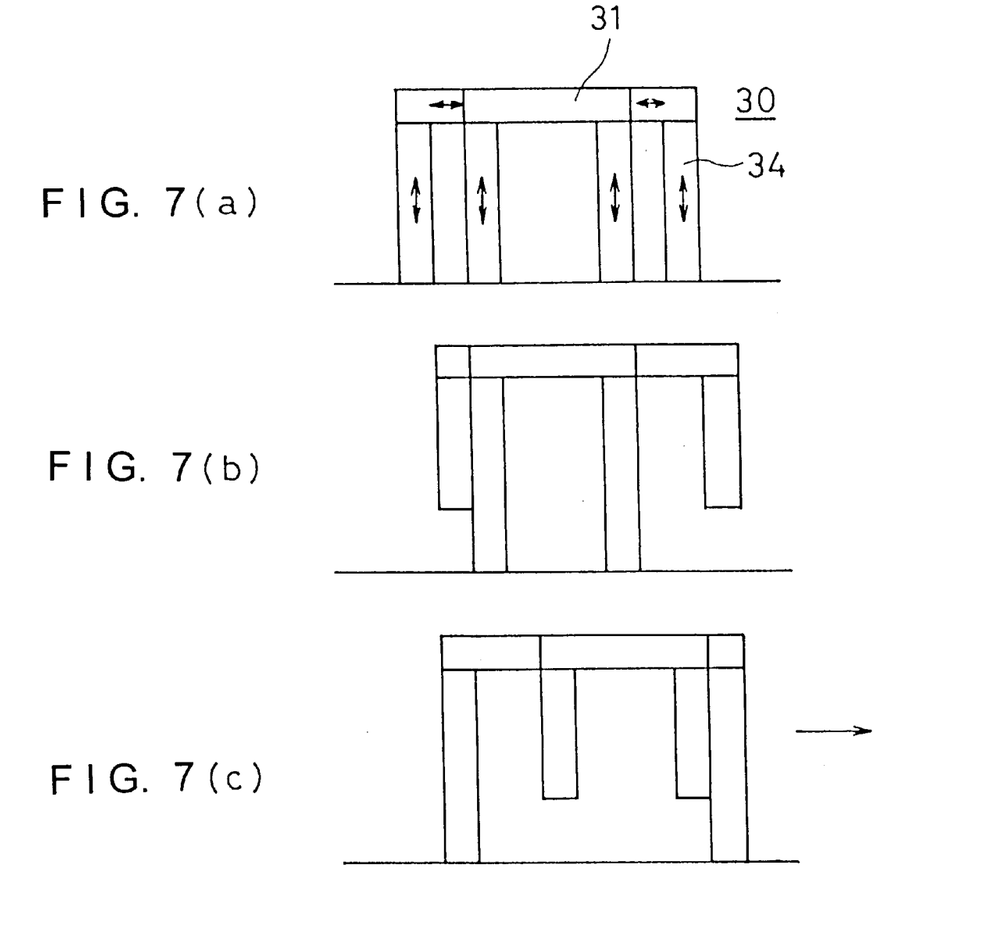
FIGS. 7(a) to 7(c) are views for illustrating the operation of the minute mobile mechanism in accordance with the present invention.

FIGS. 7(a)–7(c) illustrate the operation of the minute mobile mechanism 30 thus completed. In FIG. 7(a), one Z plate crystal substrate 31 constituting a top base is supported by four Z plate crystal substrates 34 constituting legs. By extending/contracting the comb tooth shaped displacement mechanism formed on each Z plate crystal substrate 34 in the arrow-marked direction, the mobile portion of the minute mobile mechanism 30 is configured. In FIG. 7(b), by extending two legs at the center and contracting two legs at the ends, the body is supported by two legs at the center, and one side of the upper displacement mechanism is extended and the other side thereof is contracted. Next, in FIG. 7(c), by extending two legs at the ends and contracting two legs at the center, the body is supported by two legs at the ends, and the extension and contraction or the upper displacement mechanism is reversed. By repeating the operation shown in FIGS. 7(b) and 7(c), the mobile mechanism 30 can be moved in the arrow-marked direction in FIG. 7(c).

Figure 8A:
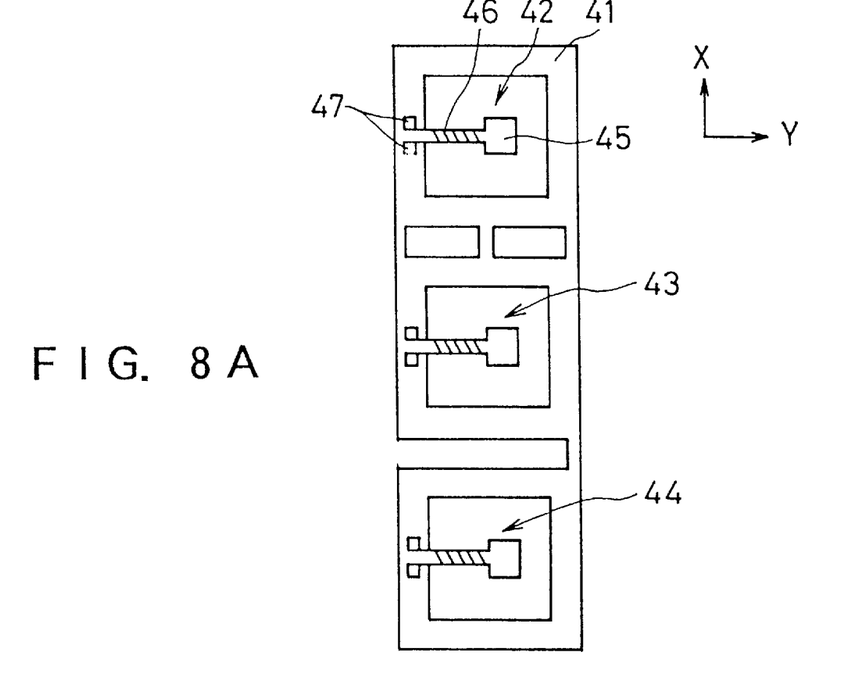
FIGS. 8(a) and 8(b) are schematic views showing a method for forming a three-dimensional acceleration sensor in accordance with the present invention.
Figure 8B:
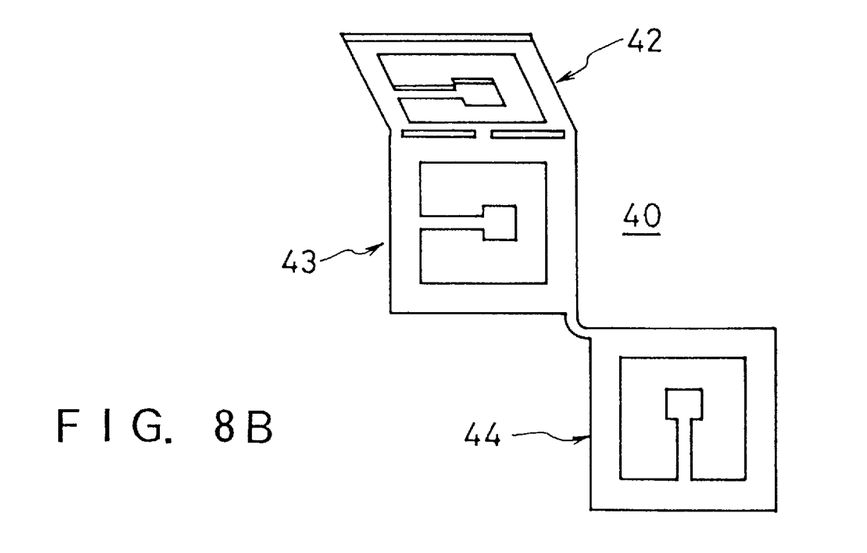

FIGS. 9(a)–9(c) show a typical configuration of a three-dimensional acceleration sensor 40 using the machining technology in accordance with the present invention. In FIG. 8(a), a Z plate crystal plate 41 is formed with three acceleration sensors 42, 43, and 44 in one plane. Each acceleration sensor comprises a weight 45, a sensor section 46 having an electrode on four faces each, and electrode terminals 47 for detecting an electric charge produced at the sensor section 46 by deflection, so that an electric charge is produced in response to the displacement of crystal in the X crystal axis direction. For this crystal plate formed in one plane, one sensor portion 42 is bent in the vertical direction with the central sensor portion 43 being a reference, and another sensor portion 44 is bent 90 degrees in the horizontal direction as shown in FIG. 8(b), by which a three-dimensional acceleration sensor 40 can be configured. This three-dimensional acceleration sensor 40 can also be attached onto a silicon substrate formed with a driving circuit by the working method of the already described embodiment. For the wiring of each acceleration sensor, a method can also be used in which after wires are connected in one plane by the wire bonding method, a bending operation is performed.

Figure 9A:
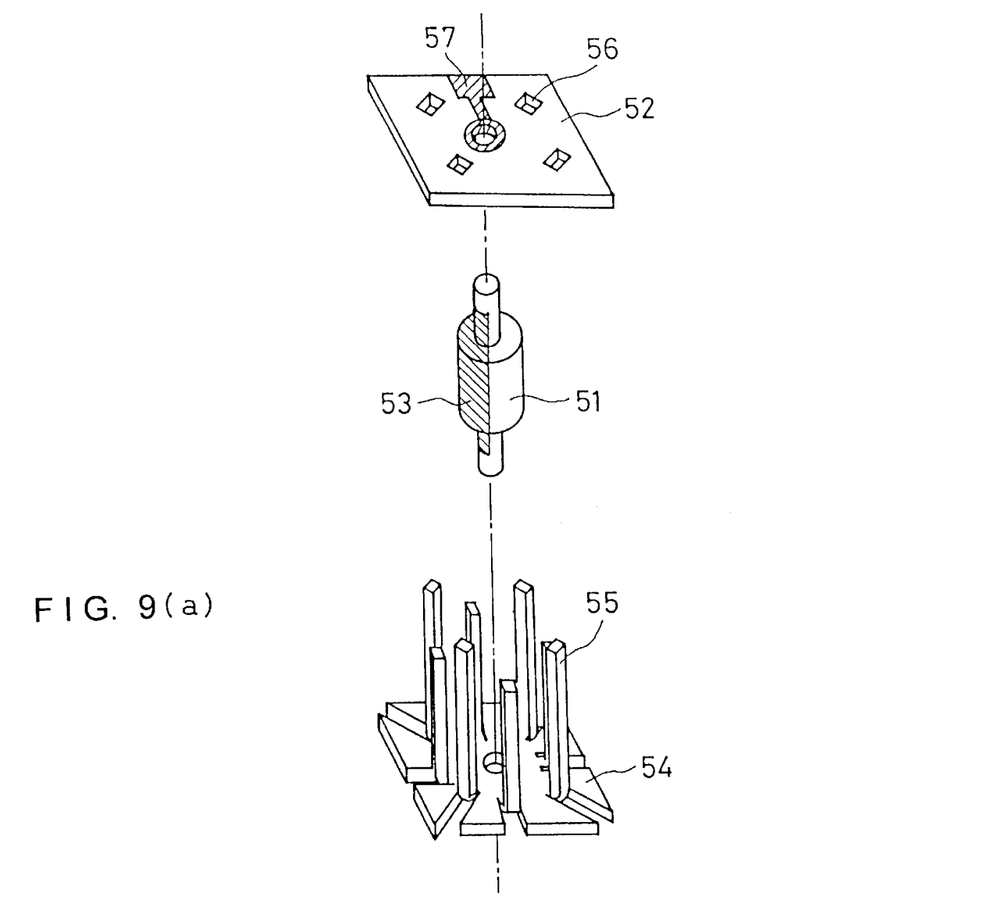
FIGS. 9(a) and 9(b) are schematic views showing a configuration of a minute electrostatic motor and a working method for the same in accordance with the present invention.

FIGS. 9(a)–9(c) show a typical configuration of an electrostatic motor 50 using the machining method in accordance with the present invention. As shown in FIG. 9(a), the electrostatic motor comprises a rotor 51, an upper bearing 52, and a lower bearing 54. The rotor 51 is formed by fusion welding a capillary of low-melting glass at the center of a quartz fiber with a diameter of about 60 micrometers, and an electrode 53 is deposited on one side face to give electric charges to only one side of the rotor 51.

The upper bearing 52, which is made of a crystal substrate, is formed with four through holes 56 which allow columns 55 on the lower bearing substrate 54 to pass therethrough, and is also formed with a hole for making the rotor 51 pass through at the center thereof. The hole at the center is formed with an electrode 57 at a portion indicated by hatching to make electrical connection with the rotor 51.

The lower bearing substrate 54, which is also made of a crystal substrate, is formed with a hole for making the rotor 51 pass through at the center thereof, and is also formed with eight columns 55, which are formed with electrodes For rotating the rotor 51, by the bending technology in accordance with the present invention. Of these columns, four columns are long, and four columns are short. The short columns support the upper bearing substrate 52. The long columns pass through the upper bearing substrate 52, and the tip ends of the columns having passed through the upper bearing are melted to join the upper and lower bearings to each other. For the shaft of the rotor 51, both of the ends are melted so that the rotor can be rotated.

Figure 9B:
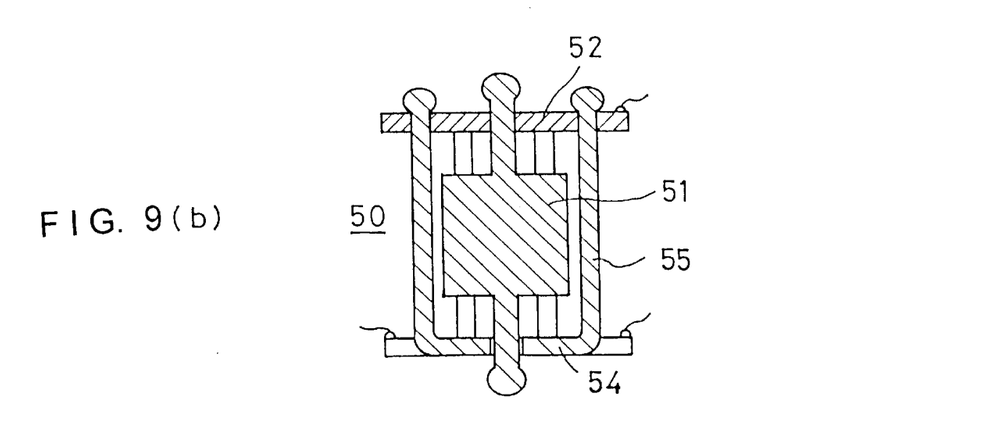

FIG. 9(b) is a sectional view of the electrostatic motor thus assembled. Positive or negative electric charges are given to the rotor 51, and the electric charges given to the columns 55 are changed sequentially, by which the rotor can be rotated. This electrostatic motor thus formed can have a greater length in the axial direction than an electrostatic motor in which the rotor length is formed by etching of conventional substrate, so that a higher torque can be obtained.

As described above, a minute structure formed by applying the photolithography and anisotropic etching technologies to a mono-crystalline substrate is heated locally by a heating means to produce a plastic deformation, by which a three-dimensional structure can be formed. The structure to be worked is not limited to a mono-crystalline substrate, and a glass substrate cut by laser and other substrates can be applied.

A carbon dioxide laser is used as a heating means in the above embodiments. Besides, various lasers such as a carbon monoxide laser, excimer laser, YAG laser, and argon ion laser can be used. At this time, it is necessary to change the intensity of irradiated beam in accordance with the energy absorption coefficient of laser beam on the work. In order to bend a silicon substrate cantilever of 100 nm in diameter by using a carbon dioxide laser, a laser having an output intensity of about 1 to 10 W is needed.

However, the heating means used for the present invention is not limited to the above-described lasers, and any electromagnetic wave having a wavelength absorbed by a specimen to be worked may be used. In the above embodiments, a laser beam, which is common among such electromagnetic waves, has been used.

In the above embodiments, working has been performed by condensing a laser beam with a lens. In this case, the carbon dioxide laser has a working resolution of about 10 micrometer because of the limitation of wavelength. In the case where minute working is needed, a waveguide should be used. For the carbon dioxide laser, silver halide (silver chloride, silver bromide) polycrystalline fiber, chalcogen element (S, Se, Te) base glass fiber, etc. can be used as a waveguide.

Figure 10:
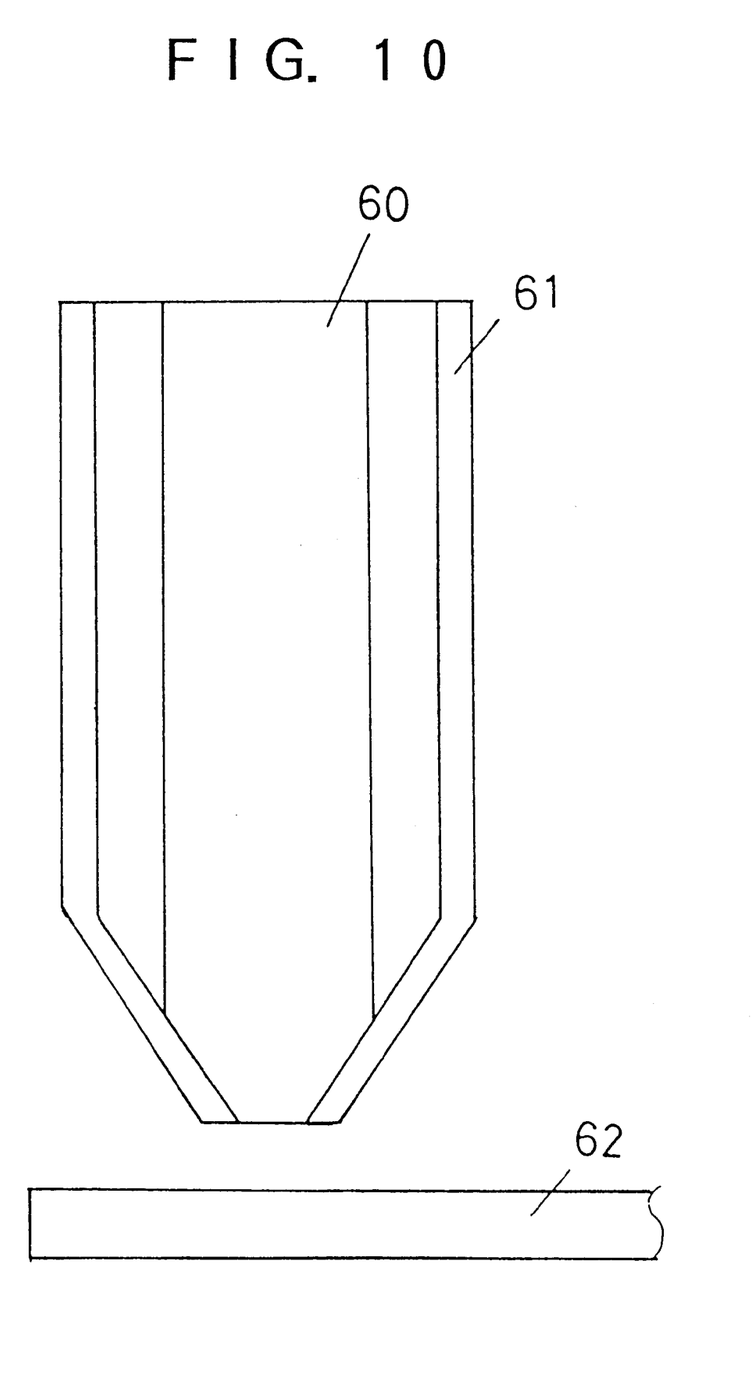
FIG. 10 is a schematic view showing a waveguide probe for processing a minute region in accordance with the present invention.

As shown in FIG. 10, by coating a waveguide 60, whose tip end is sharpened, with an electromagnetic wave reflecting material 61 such as gold except for the tip end thereof, a laser beam can be irradiated to a region of about 1 micrometer. In this case, working is performed by moving the waveguide in the horizontal direction in such a manner that it is close to a workpiece 62. By controlling the distance between the tip end of the waveguide 60 and the work 62, more accurate working can be accomplished.

Figure 11:
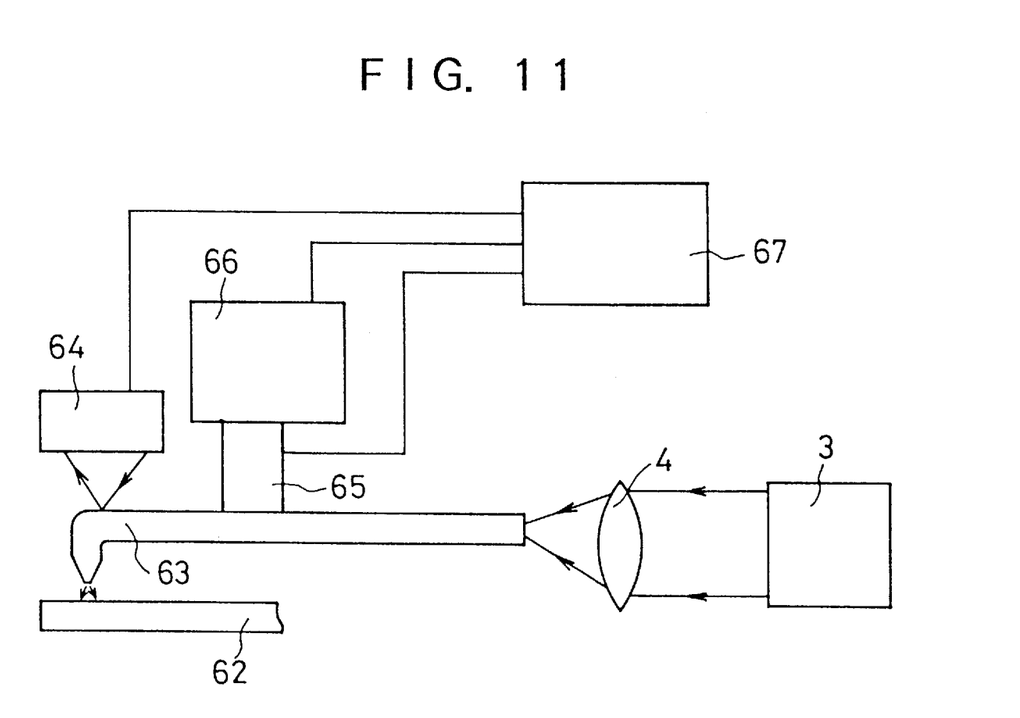
FIG. 11 is a schematic view showing a driving apparatus for waveguide probe for processing a minute region in accordance with the present invention.

FIG. 11 shows a typical configuration of a mechanism for controlling the distance between a waveguide probe 63 and the workpiece 62. In FIG. 11, the cantilever shaped waveguide probe 63 having elasticity is brought close to the workpiece 62, and by detecting an elastic deflection of the waveguide probe 63 by using a displacement detecting means 64, the tip end of the waveguide probe 63 is brought into contact with the workpiece 62 by a weak force. A Z axis displacement means 65 is used for this distance control, and the movement in the plane direction is accomplished by an XY scanning means 66. These means are controlled by a controller 67. According to this method, monitoring can be performed by tracing the shape of workpiece by the tip end of the waveguide probe 63, so that more accurate working can be carried out.

The present invention, which is carried out in the above-described embodiments, achieves effects described below. By locally heating a minute structure using a heating means to produce a plastic deformation, bending of minute structure and deforming of minute tip end, which were difficult to do by using the conventional machining technology, are made possible. Thereby, joining of minute structures to each other, which was difficult to do by using the conventional machining method, is made possible, and the formation of a three-dimensional structure is made possible.

What is claimed is:

1. A method of fabricating a microstructure having a second shape from a microstructure having a first shape, comprising the step of:
  plastically deforming the microstructure having the first shape by heating a portion thereof to form a microstructure having the second shape.

2. A method according to claim 1; wherein the microstructure having the first shape comprises a monocrystalline substrate patterned by photolithography and anisotropic etching.

3. A method according to claim 1; wherein the step of plastically deforming is achieved through the absorption of electromagnetic energy by the microstructure having the first share so that a heated portion of the microstructure causes a deformation therein, the electromagnetic energy being produced by the irradiation of an electromagnetic wave onto a selected portion of the microstructure having the second shape.

4. A method according to claim 3; wherein the electromagnetic wave is a laser beam.

5. A method according to claim 1; wherein the microstructure having the first shape includes a cantilever beam at a portion thereof, and the step of plastically deforming comprises the bending of the cantilever beam to form the microstructure having the second shape.

6. A method according to claim 1; wherein the microstructure having the first shape comprises a substrate having a thin connecting portion connecting two parts of the microstructure, and the step of plastically deforming comprises heating of the microstructure in the vicinity of the connecting portion to cause the microstructure to bend about the connecting portion to form a folded structure.

7. A method according to claim 1; wherein the microstructure having the first shape includes a cantilever beam, and the step of plastically deforming comprises heating a tip portion of the cantilever beam, by which the diameter of the tip portion of the said cantilever beam is enlarged.

8. A method according to claim 1; further comprising the step of inserting a cantilever beam formed in the microstructure having the first shape into a through hole formed in a second microstructure so that the tip portion of the cantilever beam passes through the through hole; and wherein the step of plastically deforming comprises heating the tip portion of the cantilever beam so that the tip portion becomes plastically deformed and the diameter thereof becomes larger than the diameter of the through hole, by which the microstructures are joined to each other.

9. A method according to claim 3; further comprising the step of covering the periphery of the selected portion of the microstructure by an electromagnetic wave blocking material so that portions of the microstructure outside the selected portion are not exposed to the heating.

10. A method according to claim 9; wherein the electromagnetic wave blocking material comprises a metallic thin film.

11. A method according to claim 3; wherein the electromagnetic wave is propagated by a waveguide, and the step of plastically deforming is performed by locally heating a portion of the microstructure having the first shape by irradiating the microstructure with the electromagnetic wave from a tip portion of the waveguide.

12. A micromachining method according to claim 11; wherein the tip portion of the waveguide is sharpened, and is covered by an electromagnetic blocking material such that a small opening is formed at an end face of the tip portion.

13. A method according to claim 11; wherein the waveguide has a portion having elasticity, and the step of plastically deforming is performed by maintaining the tip portion of the waveguide in contact with the surface of the microstructure having the first shape, monitoring the position of the tip portion and controlling the position of the waveguide so that the tip portion is maintained at a predetermined position.

14. A method according to claim 1; further comprising the step of forming the microstructure having the first shape by patterning a substrate to have the first shape.

15. A method according to claim 1; wherein the microstructure having the first shape comprises a patterned substrate formed of a monocrystalline material.

16. A method according to claim 15; wherein the substrate is formed of monocrystalline silicon.

17. A method according to claim 15; wherein the substrate is formed of crystal.

18. A method according to claim 1; wherein the first shape is essentially two-dimensional and the microstructure having the first shape comprises a substrate patterned by photolithography and etching to have a patterned portion which causes deformation of the microstructure when subjected to local heating.

19. A method according to claim 18; wherein the microstructure having the first shape comprises a substrate and the patterned portion comprises one or more score lines formed in the substrate, so that local heating of the substrate in the vicinity of the one or more score lines causes the substrate to fold thereabout.

20. A method according to claim 18; wherein the microstructure having the first shape comprises a substrate and the patterned portion comprises a cantilever beam formed in a surface of the substrate by patterning of the substrate surface.

21. A method according to claim 18; wherein the microstructure having the first shape comprises a substrate and the patterned portion comprises a cantilever beam having at one end a base portion connected to the remainder of the substrate and having at another end a tip portion extending from the base portion and being free from other portions of the substrate, so that local heating of the cantilever beam in the vicinity of the base portion causes the cantilever beam to fold whereby the tip portion becomes extended from the remainder of the substrate, and local heating of the tip portion of the cantilever beam causes the diameter of the tip portion to become enlarged.

22. A method according to claim 6; wherein the microstructure having the first shape comprises a substrate, the thin connecting portion comprises one or more score lines formed in the substrate, so that local heating of the substrate in the vicinity of the one or more score lines causes the substrate to fold thereabout.

23. A method according to claim 20; wherein the cantilever beam is formed in a surface of the microstructure having the first shape; and wherein the step of plastically deforming comprises bending the cantilever beam to extend from the microstructure having the first shape to form the microstructure having the second shape.

24. A method according to claim 23; wherein the step of bending the cantilever beam comprises the step of heating a portion of the cantilever beam so that surface tension therein causes the cantilever beam to bend.

25. A method according to claim 8; wherein the microstructure having the first shape comprises a substrate having a device formed therein and the second microstructure comprises a support substrate, whereby the joining of the microstructures is performed in order to fixedly mount the device to the supporting substrate.

26. A method according to claim 25; wherein the device comprises a crystal oscillator.

27. A method according to claim 25; wherein the device comprises a diaphragm type pressure sensor; and further comprising the step of applying an adhesive material layer between the microstructure having the first shape and the support substrate so that an interface between the microstructures is air tight.

28. A method according to claim 25; wherein the device comprises a rotor of an electrostatic motor, and the support substrate comprises a bearing.

29. A method of fabricating a microstructure comprising the steps of:

patterning a first microstructure by etching a portion of the first microstructure to form a plastically deformable portion;

heating the first microstructure in the vicinity of the etched portion to cause the plastically deformable portion to become extended from remaining portions of the first microstructure;

patterning a second microstructure to form a hole therein and placing the extended plastically deformable portion of the first microstructure in the hole so that a tip portion of the plastically deformable portion extends through the hole; and heating the tip portion of the plastically deformable portion so that a diameter thereof becomes larger than the hole and the first and second microstructures become fixedly attached.

* * * * *